US007128570B2

(12) United States Patent
Oosterlaken et al.

(10) Patent No.: US 7,128,570 B2
(45) Date of Patent: Oct. 31, 2006

(54) METHOD AND APPARATUS FOR PURGING SEALS IN A THERMAL REACTOR

(75) Inventors: Theodorus Gerardus Maria Oosterlaken, Oudewater (NL); Frank Huussen, Bilthoven (NL); Herbert Terhorst, Amersfoort (NL); Jack H. Van Putten, Den Dolder (NL)

(73) Assignee: ASM International N.V. (NL)

( * ) Notice: Subject to any disclaimer, the term of this patent is extended or adjusted under 35 U.S.C. 154(b) by 0 days.

(21) Appl. No.: 11/038,357

(22) Filed: Jan. 18, 2005

(65) Prior Publication Data
US 2005/0170306 A1 Aug. 4, 2005

Related U.S. Application Data

(60) Provisional application No. 60/538,351, filed on Jan. 21, 2004.

(51) Int. Cl.
F27D 1/18 (2006.01)
(52) U.S. Cl. ........................................ 432/242; 432/247
(58) Field of Classification Search ................ 432/241, 432/242, 244, 247
See application file for complete search history.

(56) References Cited

U.S. PATENT DOCUMENTS

| 5,207,573 | A | 5/1993 | Miyagi et al. | |
|---|---|---|---|---|
| 5,330,352 | A * | 7/1994 | Watanabe et al. | 432/152 |
| 5,567,149 | A | 10/1996 | Hansotte et al. | |
| 5,662,470 | A | 9/1997 | Huussen et al. | |
| 6,164,963 | A | 12/2000 | Weaver | |
| 6,235,121 | B1 * | 5/2001 | Honma et al. | 118/730 |
| 6,316,371 | B1 | 11/2001 | Oosterlaken et al. | |
| 6,499,768 | B1 | 12/2002 | De Ridder | |
| 6,503,079 | B1 * | 1/2003 | Kogano et al. | 432/242 |
| 6,709,525 | B1 * | 3/2004 | Song | 118/733 |
| 6,746,240 | B1 | 6/2004 | De Ridder et al. | |

* cited by examiner

Primary Examiner—Gregory Wilson
(74) Attorney, Agent, or Firm—Knobbe, Martens, Olson & Bear LLP

(57) ABSTRACT

A semiconductor processing reactor comprises a reaction chamber with a gas exhaust and a mechanical seal at one end of the chamber. The seal seals off the chamber from the ambient environment and is purged with gas to prevent diffusion of ambient gases into the reaction chamber. Because the purge gas can diffuse through the seal into the reaction chamber, the purge gas is chosen based upon the process gas and the location of the seal and exhaust so that the molecular weight of the purge gas causes the purge gas, by the force of gravity or buoyancy, to remain in the portion of the reaction chamber containing the seal and the gas exhaust. Advantageously, keeping the purge gas at the same end of the chamber as the gas exhaust minimizes dilution of the process gas with the purge gas, thereby preventing the purge gas from detrimentally effecting process results.

29 Claims, 4 Drawing Sheets

METHOD AND APPARATUS FOR PURGING SEALS IN A THERMAL REACTOR

REFERENCE TO RELATED APPLICATION

This application claims the priority benefit under 35 U.S.C. §119(e) of provisional Application No. 60/538,351, filed Jan. 21, 2004. The application is also related to U.S. Pat. No. 6,746,240, PROCESS TUBE SUPPORT SLEEVE WITH CIRCUMFERENTIAL CHANNELS, issued Jun. 8, 2004, the entire disclosure of which is incorporated herein by reference.

FIELD OF THE INVENTION

This invention relates generally to the field of semiconductor processing and, more particularly, to thermal reactors used for thermal processing.

BACKGROUND AND SUMMARY OF THE INVENTION

A thermal reactor typically comprises a reaction chamber which is sealed from the chamber's ambient environment. The reaction chamber might comprise mechanical seals at some places, e.g., at the position of an openable door which allows feeding one or more substrates into the reaction chamber, or at a position where a gas feed tube or gas exhaust tube is connected to the chamber. In chambers in which substrates are rotated during processing, the feed-through of a rotation mechanism for rotating a substrate during processing might also comprise a mechanical seal.

While these mechanical seals are preferably gas-tight to minimize process degradation due to interactions with the ambient environment, some of these seals may not be hermetic due to the high temperatures that are locally present at and around the seals. Purging of such seals with an inert gas can be performed to prevent ambient gas from entering the reaction chamber or to prevent process gases from exiting the reaction chamber at an undesirable location. Irrespective of the other gases used in processing, nitrogen gas has typically been used as the purge gas for seals, for practical and economic reasons, e.g., nitrogen gas is inert, readily available and relatively inexpensive.

It has been found, however, that this purging of the seal can itself cause undesirable complications. For example, purging can result in dilution of process gases with the purge gas. Moreover, this dilution might not be uniform over the entire volume of the reaction chamber, resulting in non-uniformities in processing results which vary depending upon location within the reaction chamber.

For example, non-uniform thermal oxide films can arise when inert gas is used to purge the rotational feed-through of a boat rotation mechanism for a reaction chamber that is part of a vertical furnace. These vertical furnaces typically comprise a door at the lower end, and the feed-through for boat rotation is typically provided in the door. An exhaust for process gas is typically also provided at the lower end of the furnace. It has been observed that when the feed-through is purged with nitrogen during an oxidation process using oxygen, the oxide thickness and uniformity is substantially affected and can vary by location within the furnace, e.g., from wafer to wafer and from one point to another on a single wafer.

Accordingly, there is a need for methods of purging a seal of a thermal reactor that does not significantly detrimentally affect the process performed within the reactor.

Thus, in accordance with one aspect of the invention, a mechanical seal at a downstream end of a thermal reactor is purged with a purging gas, wherein the selection of the purging gas depends on the density of the process gas and the position of the seal. When the seal is positioned at a lower end of the reactor, a purging gas is selected that is heavier than the process gas used. When the seal is positioned at an upper end of the reactor, a purging gas is selected that is lighter than the process gas used. Preferably, a gas exhaust is located at about the same end of the reactor as the seal. By "heavier," it is meant that the purge gas has a molecular weight that is greater than the molecular weight of the process gas. Conversely, by "lighter," the reverse is meant; that is, the purge gas has a molecular weight that is smaller than the molecular weight of the process gas.

In accordance with another aspect of the invention, a method is provided for semiconductor processing. The method comprises providing a semiconductor reactor having a reaction chamber having a mechanical seal and a gas exhaust. The mechanical seal is formed by interfacing parts of the reactor. An overpressure of purge gas is generated around the seal in a volume outside the chamber. The overpressure is an overpressure relative to the gas pressure inside the reaction chamber. The purge gas is chosen such that the purge gas remains, under the force of gravity or buoyancy, at a location proximate the mechanical seal if the purge gas enters the reaction chamber.

In accordance with yet another aspect of the invention, a vertical semiconductor reactor is provided. The reactor comprises a plurality of walls delimiting a reaction chamber. An end wall is proximate an end of the reaction chamber and comprises a mechanical seal. A surface is proximate the seal and at least partially delimits a volume surrounding the seal on a side of the end wall outside the reaction chamber. The reactor further comprises a purge gas inlet opening to the volume and in gas communication with the seal. The purge gas inlet is configured to discharge a purge gas into the volume and is connected to a purge gas source of purge gas having a purge gas molecular weight. The reactor also comprises process gas inlet for discharging process gas into the reaction chamber. The process gas inlet is connected to a process gas source of process gas having a process gas molecular weight. The process gas and purge gas are selected such that the purge gas is biased by gravity and buoyancy to the end of chamber proximate the seal.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENT

Figure 1:
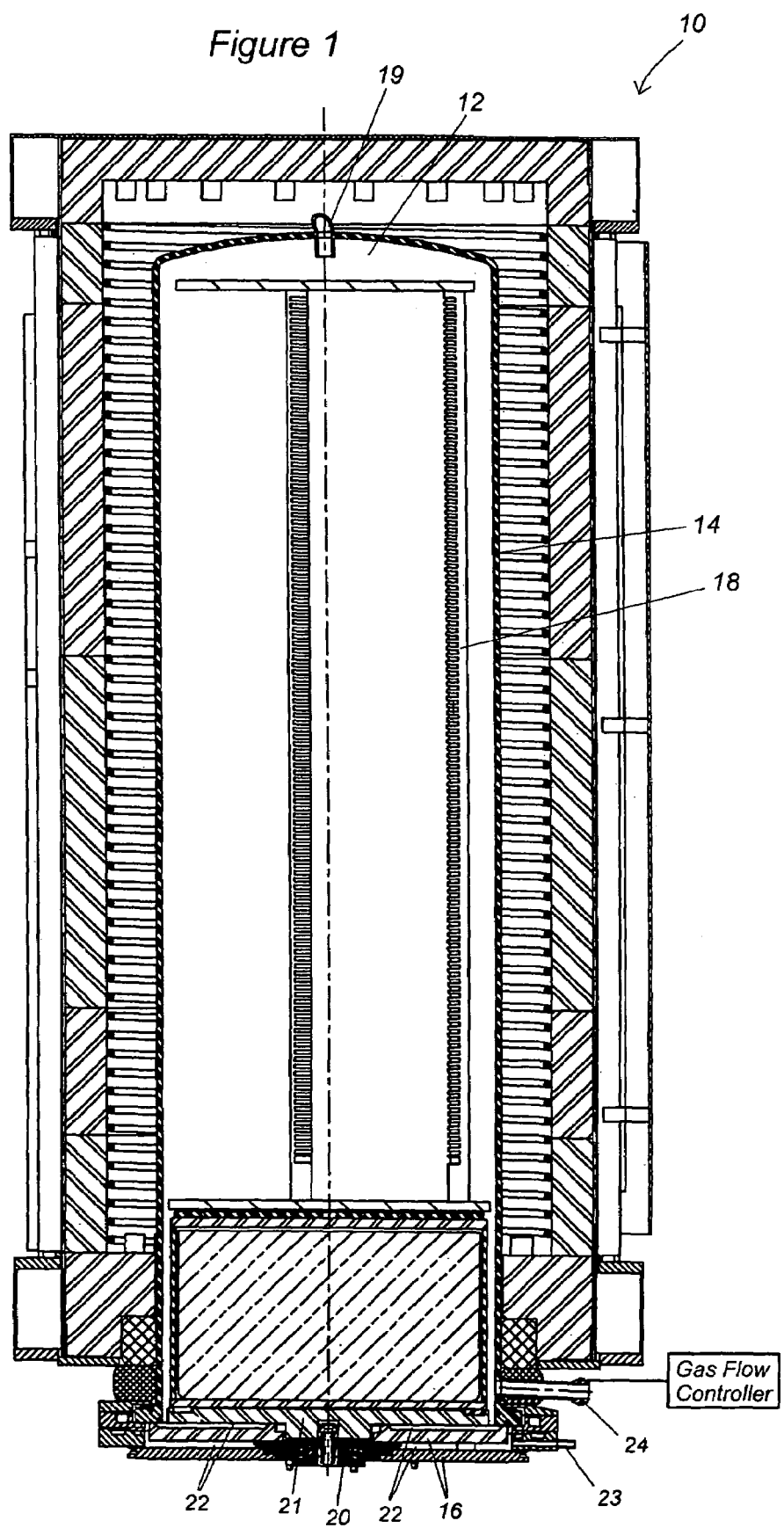
FIG. 1 is a cross-sectional side view of a furnace provided with a purged seal, in accordance with one exemplary embodiment of the invention.

While the invention has application to various reactors known in the art, it is particularly advantageous when applied to reactors that are vertical furnaces. An exemplary reactor 10 is shown in FIG. 1 and is available commercially under the trade name A412™ from ASM International, N.V. of The Netherlands. The reaction chamber 12 is delimited by a substantially cylindrical process tube 14 extending in a vertical direction. The lower side of the tube is open and can be closed with a door 16. The door 16 supports a boat 18 that accommodates a plurality of substrates, such as wafers (not shown), in a vertically stacked manner. Process gas enters the reaction chamber 12 via the process gas inlet 19 proximate the top of the reaction chamber 12 and typically flows downward to exit the reaction chamber 12 via the gas exhaust 24 proximate the bottom of the reaction chamber 12.

In the illustrated embodiment, the door 16 is provided with a boat rotation bearing 20 that is configured to be coupled with a boat rotation driving motor (not shown) such that a boat 18 supported on the door 16 can be rotated during processing. In the illustrated reactor, the boat rotation bearing 20 supports a rotating plate 21, which directly contacts and supports the boat 18. Mechanical seals are formed when various parts interface and preferably contact to, e.g., isolate the atmosphere of the chamber 12 from the ambient environment of the reactor 12. For example, the interfaces of surfaces of the rotation bearing 20 with various other surfaces, e.g., surfaces of the door 16 and the rotating plate 21, combine to form a mechanical seal for sealing off the chamber 12 from the ambient environment. The boat rotation bearing 20, however, provides a rather poor sealing function. For safety reasons, an inert gas volume 22 is maintained at the lower side of the door 16 by flowing inert or "purging" gas out of the gas inlet 23, the inert gas volume 22 having a pressure slightly higher than the pressure inside the process tube, so that a positive flow of inert gas into the reaction chamber 12 is always maintained.

It will be appreciated that the inert or purging gas can be a noble gas or other relatively inactive gas. By providing an overpressure of inert gas, process gas can be prevented from leaking out of the chamber 12 through the bearing 20. The exhaust 24 for process gas is preferably positioned near the rotation bearing 20 in the lower end of the process tube 14 such that a large part of the purging gas will typically be directly exhausted from the reaction chamber 12. Some purge gas may also be indirectly exhausted due to leakage through the bearing 20. As illustrated, both the exhaust 24 and the rotation bearing 20 are at a downstream end of the reaction chamber 12.

Figure 2:
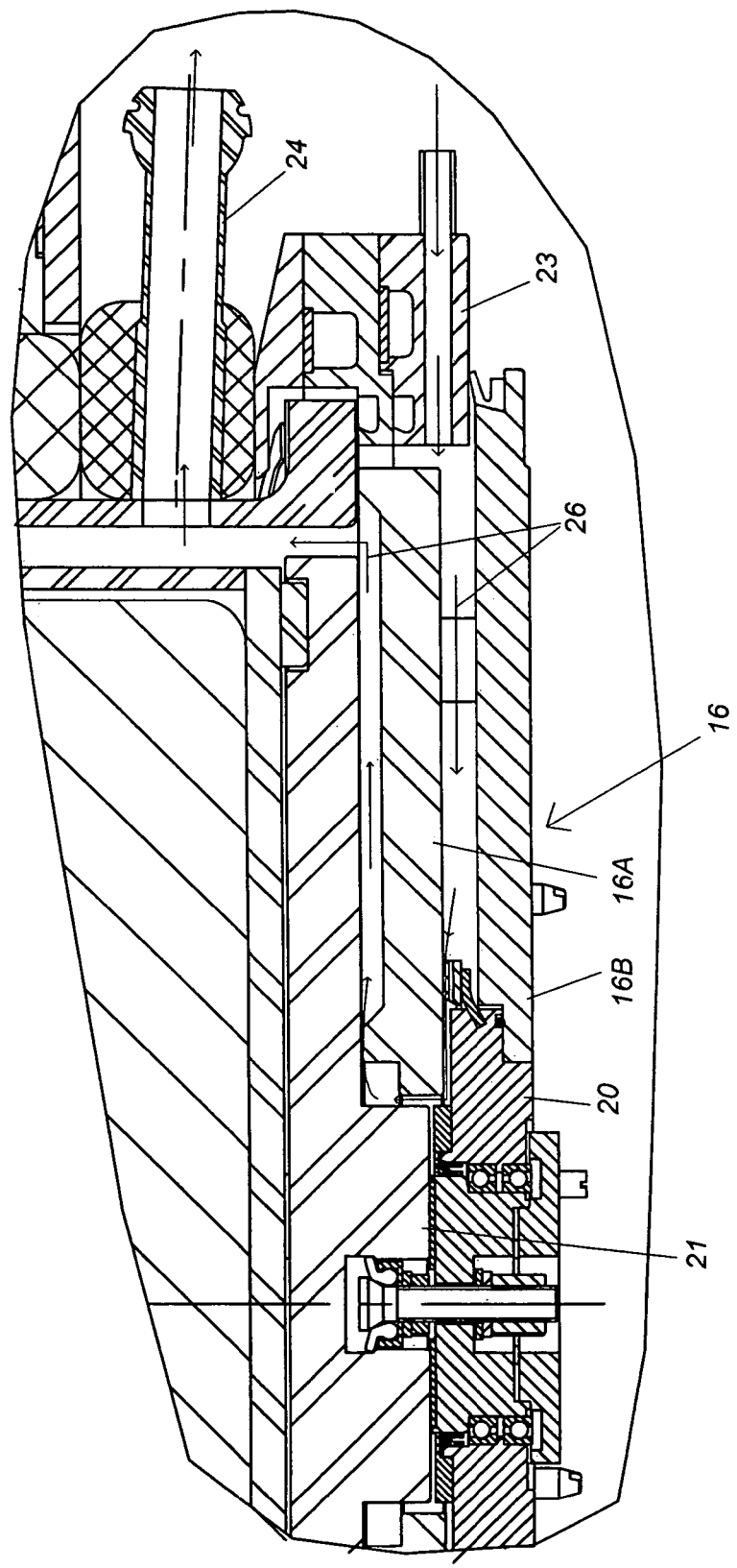
FIG. 2 is an enlargement of the lower section of FIG. 1, showing the purged seal in greater detail.

FIG. 2 illustrates the lower section of the reactor 10, showing the door 16, the inert gas volume 22, the exhaust 24 and the rotation bearing 20 in greater detail. Arrows 26 illustrate the flow of purge gas through the gas volume 22, with the gas entering the volume from the gas inlet 23 and exiting via the exhaust 24. The door 16 in the illustrated embodiment preferably comprises a high heat resistance upper door plate 16A formed of a highly heat resistant material such as quartz, for heat resistance closer to the reaction chamber 12, and a lower door plate 16B underneath the upper door plate 16A, formed of a lower heat resistance material such as a metal, since the requirements for heat resistance are less for the lower door plate 16B.

Even given the proximity of the rotation bearing 20 to the exhaust 24, it has been found that purge gas can detrimentally affect process results. For example, it has been found that the thickness and uniformity of an oxide film formed by thermal oxidation in $O_2$ is detrimentally influenced when the seal is purged with $N_2$ whereas no such influence is observed when the seal is purged by Ar.

Figure 3:
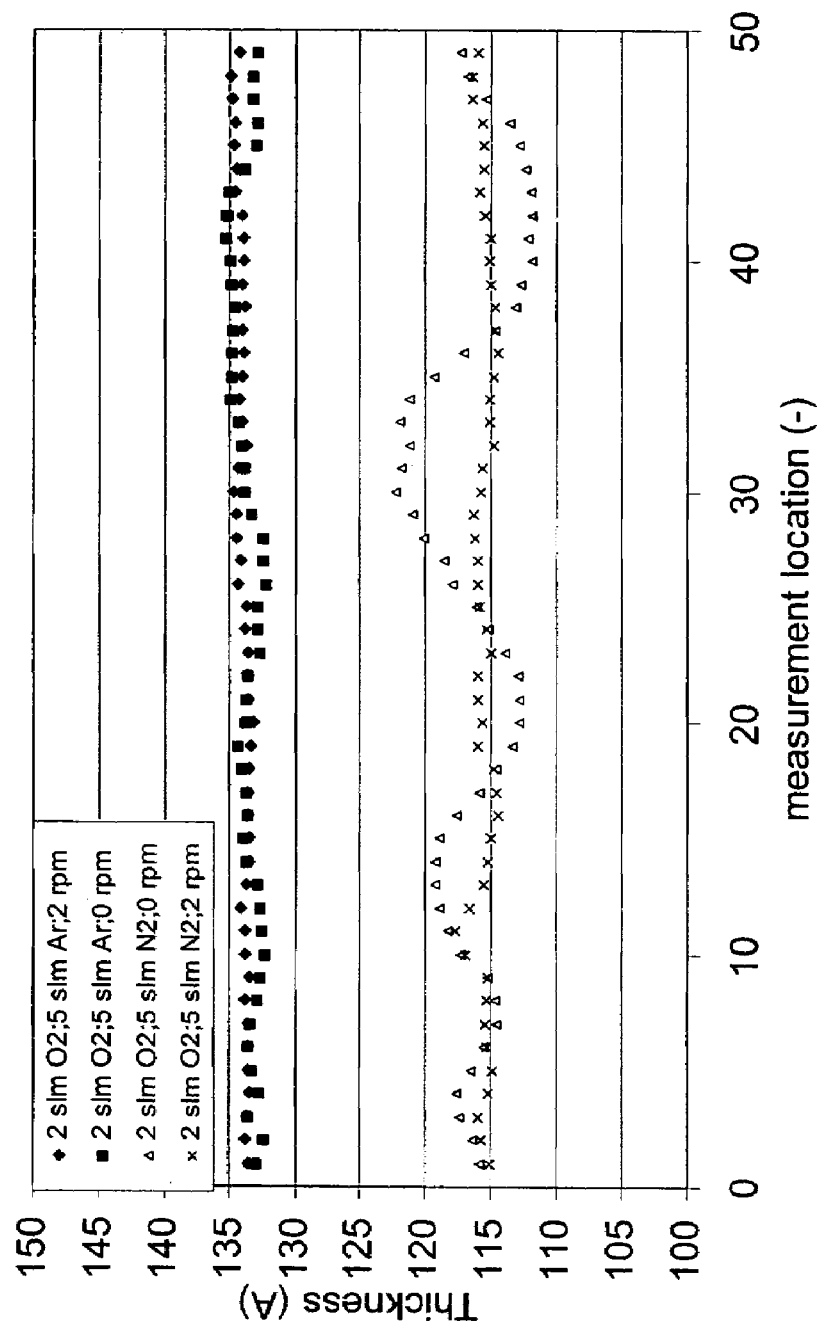
FIG. 3 is a graph showing thicknesses for oxide films formed on a silicon substrate using $O_2$ as a process gas and $N_2$ and Ar as purge gases for a seal.

An exemplary process in which this effect occurs is shown in FIG. 3. An oxygen flow of 2 slm was fed through the process tube and a flow of 5 slm of inactive purge gas ($N_2$ or Ar) was fed through the boat rotation bearing in the door plate. The thickness of an oxide film formed on a wafer accommodated near the lower end of the wafer boat was measured. When $N_2$ was used as a purging gas, a much thinner oxide film was formed than when Ar was used as a purging gas.

It will be appreciated that the molecular weight of $N_2$ is 28, which is less than the molecular weight of $O_2$, which is 32. While the invention is not limited by theory, it is believed that a significant part of the lighter $N_2$ gas is not directly exhausted but has a tendency to rise inside the reaction chamber, despite the overall gas flow direction, which is typically directed downwardly. By so rising, the $N_2$ forms a "bubble" which is difficult to purge out and which locally influences the $O_2$ concentration.

When using Ar as a purging gas, no such effect was observed. This may be explained by the fact that the atomic weight of Ar is 40, which is larger that that of $O_2$. As a result, it appears that Ar does not have a tendency to rise into the $O_2$ atmosphere. The Ar typically remains in the bottom end of the reaction chamber and can be directly exhausted before it is able to reach the wafers to detrimentally influence process results.

As can also be seen in FIG. 3, wafer boat rotation did not significantly alter these results; while the variation in thickness over the surface of the wafer is larger without boat rotation, the identity of the purge gas affected the process results even when the wafer boat was rotated. This is believed to be the case because the gravity induced flow pattern will have the largest effect at the bottom side of the reaction chamber laterally opposite the location of the exhaust. The $N_2$ "bubble" appears to be most pronounced and persistent at the bottom of the reaction chamber and on the lateral side opposite the exhaust. By rotating the boat this variation in oxide thickness smears out into a rotationally symmetrical pattern. The boat rotation, however, is not able to increase the oxide thickness, since the purge gas still has the effect of diluting the concentration of the process gas.

Figure 4:
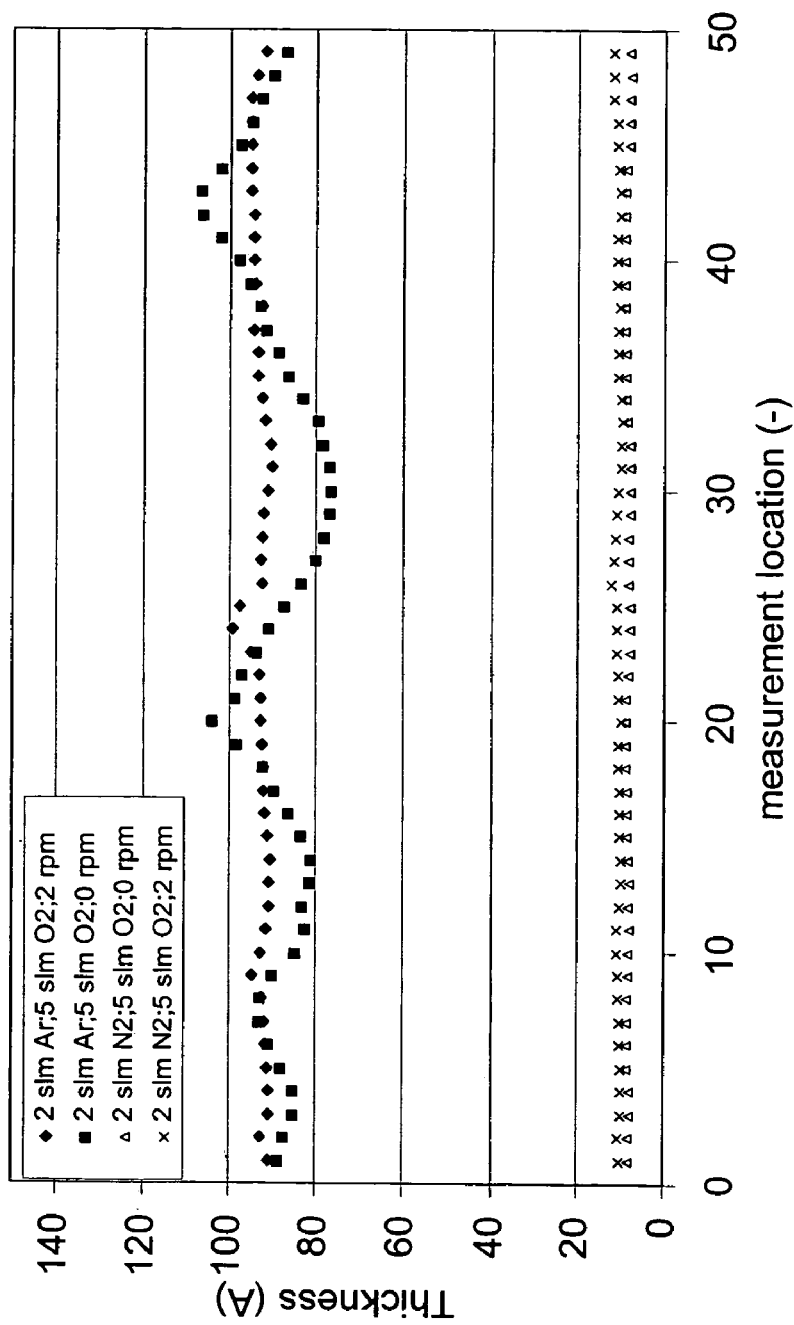
FIG. 4 is a graph showing thicknesses for oxide films formed on a silicon substrate in an experiment in which the process and purge gases of FIG. 3 were reversed, wherein $N_2$ and Ar were injected into a reaction chamber as a substitute for process gases and $O_2$ was used as the purge gas for a seal.

In an experiment to verify that molecular weight and gas density were responsible for the observed process results, the gas flows were reversed: $O_2$ was fed through the boat rotation bearing and $N_2$ or Ar was fed through the process tube. The oxide thickness formed on a wafer accommodated near the lower end of the wafer boat was measured and is represented in FIG. 4. It was found that when Ar was fed through the tube, a significant thickness of oxide was formed on the semiconductor substrate, as $O_2$ purged through the boat rotation bearing will have a tendency to rise and reach the semiconductor substrate. When $N_2$ was fed through the process tube, the heavier $O_2$ tended to remain in the bottom end of the tube and did not reach the semiconductor substrate, resulting in very little oxide formation. In this case also, wafer boat rotation did not counteract the effect of the selection of the purge gas. It will be appreciated, however, that the distance between a substrate and the mechanical seal being purged, e.g., the interface between the rotation bearing 20 and the door 16, can affect process results; that is, substrates near the seal are more likely to come into contact with the purge gas and, so, have process results that are more affected by the purge gas than substrates at the opposing end of the reaction chamber.

It will also be appreciated that although the preferred embodiments are explained with reference to specific examples, they can be applied more generally and are not limited to these examples. For instance, while a boat rotation bearing has been discussed for ease of description, the preferred embodiments can be applied to other seals that are not hermetically sealed and/or that require purging by a purge gas. One example of such a seal includes a door plate seal, including seals for quartz door plates which mechanically seal to the flange of a quartz tube, and wherein a slight overpressure of inert gas is applied to the outside of the quartz door to prevent ambient gas from penetrating the mechanical seal. Another example of a type of seal for which the preferred embodiments can advantageously be applied is a seal for a ball joint connection. An exemplary ball joint connection with a seal which can be located towards the top of a reaction chamber and having a groove connected to a source of nitrogen is disclosed in U.S. Pat. No. 6,499,768, JOINT ASSEMBLY FOR CONNECTING TWO TUBES, issued Dec. 31, 2002, the entire disclosure of which is incorporated herein by reference. Yet another example of a seal to which the preferred embodiments can be applied is a seal for a process tube support structure, especially in cases where an inert gas is made to flow out of the structure to form a gas seal. A process tube support structure having such a gas seal is described in U.S. Pat. No. 6,746,240, PROCESS TUBE SUPPORT SLEEVE WITH CIRCUMFERENTIAL CHANNELS, issued Jun. 8, 2004, the entire disclosure of which is incorporated herein by reference.

In addition, while $O_2$ is mentioned as a process gas and Ar as a preferred purging gas, these gases are discussed simply to illustrate the desired relationship between process gases and purge gases. Thus, other combinations of gases are possible, so as long as, in the case of a gas exhaust and a mechanical seal to be purged positioned near a lower end of the reaction chamber, the purge gas has a higher molecular weight or density than the process gas. For example, where $O_2$ is used as a process gas, higher molecular weight gases such as the relatively inactive gases $N_2O$ and/or $CO_2$ can be used as heavy purge gases. Thus, depending on the process gas used, non-limiting examples of other purge gases include $N_2$, Ar, $N_2O$, $CO_2$, He, Ne and Kr. In some embodiments, the purge gas can be the same or a different gas from a carrier gas which is used to deliver reactants to the reaction chamber. Introduction of the various purge and process gases can by a microprocessor or computer based gas flow controller, with the controller configured to select the appropriate purge gas(es) based upon process gas(es), e.g., based upon the molecular weight or density of the process gas(es) and purges gas(es).

In cases where the exhaust and the mechanical seal to be purged are situated at an upper end of the reaction chamber, a purge gas that is lighter than the process gas is preferably selected. Thus, in these cases, the purge gas preferably has a lower molecular weight or density than the process gas.

In general, the purge gases and process gases are preferably chosen such that, upon entering the reaction chamber, the molecular weights and densities of these gases prevents formation of "bubbles" of purge gas in the space occupied by substrates. Where a purged mechanical seal and gas exhaust are located in the same portion of the reaction chamber, the purge and process gases are preferably chosen such that the purge gas remains in that portion of the chamber due to the force of gravity or buoyancy effects. In addition, to minimize the dilution of process gas with purge gas in the volume in which substrates are reacted, the purged mechanical seal and the exhaust are preferably located in the same portion of the reaction chamber and away from the substrates.

In addition, while the purge and process gases have been discussed as being pure gases, neither the process gas nor the purge gas need be pure gases having a single chemical species. Instead, one or the other, or both may be mixtures of pure gases. For example, the process gas can be mixtures of reactant gases and carrier gases. Preferably, the above discussed molecular weight relationship is maintained, for example, by reference to the average molecular weights of the gas mixtures. For example, where a gas exhaust and the mechanical seal to be purged are positioned near a lower end of the reaction chamber, the average molecular weight of the purge gases is preferably greater than the average molecular weights of the process gases. For example, a mixture of 50% $N_2$/50% Ar has an average molecular density of $(28+40)/2=34$ allowing it to be used as a process gas in conjunction with $O_2$ which has a lower molecular weight of 32. In other embodiments, it will be appreciated that in cases where the exhaust and the seal are situated at an upper end of the reaction chamber, the average molecular weight of the purge gases is preferably less than the average molecular weight of the process gases.

Accordingly, it will be appreciated by those skilled in the art that other various omissions, additions and modifications can be made to the processes described above without departing from the scope of the invention. All such modifications and changes are intended to fall within the scope of the invention, as defined by the appended claims.

We claim:

1. A method for purging a mechanical seal, comprising:
providing a thermal reactor having a reaction chamber, the reaction chamber provided with a gas feed for feeding a process gas into the reaction chamber and a gas exhaust disposed at a downstream end of the reaction chamber for exhausting gases from the chamber, wherein mutually contacting reactor parts form a mechanical seal disposed near the downstream end;
feeding the purge gas across an interface between the reactor parts to an interior of the reaction chamber;
determining a density of the process gas; and
selecting the purge gas such that when the downstream end is at a lower end of the reaction chamber a purge gas is selected with a higher density than the process gas and when the downstream end is at an upper end of the reaction chamber a purge gas is selected with a lower density than the process gas.

2. The method of claim 1, wherein the process gas comprises oxygen.

3. The method of claim 2, wherein the seal is located at a bottom portion of the reaction chamber and wherein the purge gas comprises Ar.

4. The method of claim 3, wherein the seal seals a feed-through for a wafer boat rotation mechanism.

5. The method of claim 1, wherein the purge gas is selected from the group consisting of $N_2$, Ar, $N_2O$, $CO_2$, He, Ne and Kr.

6. The method of claim 1, wherein the process gas is a mixture of reactant and carrier gases.

7. The method of claim 6, wherein the purge gas is a mixture of gases.

8. The method of claim 7, wherein the seal is located at a bottom portion of the reaction chamber and wherein an average molecular weight of the purge gas is greater than an average molecular weight of the process gas mixture.

9. The method of claim 1, wherein the density of the process gas and the density of the purge gas is determined by reference to the molecular weights of constituents of the process and purge gases.

10. A method for semiconductor processing, comprising:
providing a semiconductor reactor including a reaction chamber having a mechanical seal and a gas exhaust, wherein the mechanical seal is formed by interfacing parts of the reactor; and
generating an overpressure, relative to a gas pressure inside the reaction chamber, of purge gas around the seal in a volume outside the chamber,
wherein the purge gas is chosen such that the purge gas remains, under the force of gravity or buoyancy, at a location proximate the mechanical seal if the purge gas enters the reaction chamber.

11. The method of claim 10, wherein the mechanical seal is at a bottom portion of the reaction chamber and wherein generating an overpressure comprises flowing inert gas into the volume.

12. The method of claim 11, wherein the inert gas has an average molecular weight greater than an average molecular weight of gas inside the reaction chamber.

13. The method of claim 12, wherein the reaction chamber comprises a gas exhaust at a bottom portion of the reaction chamber.

14. The method of claim 10, wherein the purge gas comprises argon.

15. A method for semiconductor processing, comprising:
providing a vertical reaction chamber having a gas exhaust proximate an end of the chamber and an opening for inert gas; and
flowing inert gas through the opening into the chamber while process gas is injected into the chamber,
wherein the gas exhaust and opening are proximate a downstream end of the chamber and wherein the inert gas is chosen such that the inert gas is biased by gravity and buoyancy to the end of the chamber proximate the gas exhaust.

16. The method of claim 15, wherein the chamber comprises a mechanical seal, wherein the mechanical seal comprises the opening for inert gas.

17. The method of claim 16, wherein the mechanical seal and the gas exhaust are at a bottom end of the reaction chamber.

18. The method of claim 17, wherein the inert gas has a greater molecular weight than the process gas.

19. The method of claim 15, wherein the process gas comprises oxygen.

20. A vertical semiconductor reactor, comprising:
a plurality of walls delimiting a reaction chamber, wherein an end wall proximate an end of the reaction chamber comprises a mechanical seal;
a surface proximate the seal, the surface at least partially delimiting a volume surrounding the seal on a side of the end wall outside the reaction chamber;
a purge gas inlet opening to the volume and in gas communication with the seal, wherein the purge gas inlet is configured to discharge a purge gas into the volume and wherein the purge gas inlet is connected to a purge gas source of purge gas having a purge gas molecular weight; and
a process gas inlet for discharging process gas into the reaction chamber, wherein the process gas inlet is connected to a process gas source of process gas having a process gas molecular weight,
wherein the process gas and purge gas are selected such that the purge gas is biased by gravity and buoyancy to the end of chamber proximate the seal,
further comprising a gas flow controller configured to select the purge gas based upon the process gas molecular weight.

21. The reactor of claim 20, wherein the purge gas and the process gas each comprise one or more different pure gases, where the purge gas molecular weight is an average molecular weight of pure gases constituting the purge gas and wherein the process gas molecular weight is an average molecular weight of pure gases constituting the process gas.

22. The reactor of claim 20, further comprising a gas exhaust for exhausting gases out of the chamber, wherein the seal and the gas exhaust are located at a lower end of the reaction chamber.

23. The reactor of claim 22, wherein the purge gas has an average molecular weight greater than an average molecular weight of the process gas.

24. The reactor of claim 23, wherein the process gas comprises oxygen.

25. The reactor of claim 20, wherein the seal is a boat rotation bearing seal.

26. The reactor of claim 20, wherein the seal is a door plate seal.

27. The reactor of claim 26, wherein the door plate comprises quartz.

28. The reactor of claim 20, wherein the seal is a seal for a process tube support structure.

29. The reactor of claim 20, wherein the purge gas is selected from the group consisting of $N_2$, Ar, $N_2O$, $CO_2$, He, Ne and Kr.

* * * * *